United States Patent [19]

Fink et al.

[11] Patent Number: 5,654,548

[45] Date of Patent: Aug. 5, 1997

[54] SOURCE FOR INTENSE COHERENT ELECTRON PULSES

[75] Inventors: Hans-Werner Fink, Gattikon; Heinz Schmid, Oberrieden, both of Switzerland

[73] Assignee: International Business Machines Corporation, Armonk, N.Y.

[21] Appl. No.: 635,451

[22] Filed: Apr. 19, 1996

Related U.S. Application Data

[63] Continuation of Ser. No. 264,835, Jun. 23, 1994, abandoned, which is a continuation of Ser. No. 926,256, Aug. 6, 1992, abandoned.

[51] Int. Cl.[6] .......................... H01J 37/26; H01J 37/073
[52] U.S. Cl. .......................... 250/311; 250/423 F
[58] Field of Search .......................... 328/252; 250/306, 250/310, 311, 423 F, 423 R, 423 P

[56] References Cited

U.S. PATENT DOCUMENTS

| 2,422,041 | 6/1947 | Ramo | 250/311 |
| 3,866,077 | 2/1975 | Baker et al. | 250/311 |

FOREIGN PATENT DOCUMENTS

| 0366851 | 1/1988 | European Pat. Off. | H01J 37/073 |

OTHER PUBLICATIONS

Physical Review Letters Sep. 3, 1990 pp. 1204–1206 "Holography with Low–Energy Electrons" H–W. Fink et al pp. 1323–1324.

The American Physical Society 1990 "Holography with Low–Energy Electrons" pp. 1204–1206 #10 vol. 65 3 Sep. 90 H–W. Fink et al.

J. of Electron Microscopy V.33 #2 pp. 101–115 1984 "Applications of Electron Holography Using a Field Emission Electron Microscope" Tonomura.

J. Vac. Sci. TEchnol. B8 (6) Nov./Dec. 1990 "Coherent point source electron Beam" H–W. Fink et al pp. 1323–1324.

The American Physical Society 1990 "Holography with Low–Energy Electrons" pp. 1204–1206 #10 vol. 65 3 Sep. 90 H–W. Fink et al.

LaRecherche 234/Juillet/Aout 1991 vol. 22 "L'Holographic Electronique Sans Lentilles" pp. 964–966 H–W. Fink et al.

Physical Review Letters "Atomic Resolution in Lensless Low–Energy Electron Holography" V. 67 #12 Sep. 91 pp. 1543–1546 Fink et al.

IBM J. Res. Develop. vol. 30 #5 Sep. 1986 "Mono–atomic tips for Scanning tunneling microscopy" H–W. Fink pp. 460–465.

American Laboratory, Mar. 1979 "Channel electron multipliers" E. A. Kurz.

Nuclear Instruments and Methods 162 (1979) pp. 587–601 North–Holand Publishing Co. "Microchannel Plate Detectors" J. L. Wiza.

*Primary Examiner*—Jack I. Berman
*Attorney, Agent, or Firm*—Daniel P. Morris

[57] ABSTRACT

A source for intense coherent electron pulses of an energy below 1 keV comprises an ultrasharp electron-emitting tip and an anode both arranged in mutual alignment inside a vacuum envelope A pulsed potential with an amplitude in the range between 100 V and 500 V and with a variable pulse rate is applied between said tip and said anode. The tip is maintained negative with respect to said anode, the tip having a sharpness such that the electric field at its surface exceeds $10^7$ V/cm at said pulsed potential.

24 Claims, 2 Drawing Sheets

SOURCE FOR INTENSE COHERENT ELECTRON PULSES

This is a continuation of application Ser. No.. 08/264, 835, filed Jun. 23, 1994, now abandoned is a continuation of application Ser. No. 07/926,256, filed Aug. 6, 1992, now abandoned.

FIELD OF THE INVENTION

This invention relates to a field-emission source for intense coherent electron pulses, particularly for use in electron microscopy and spectroscopy.

BACKGROUND OF THE INVENTION

Pulsed particle beams are of interest wherever measurements with good time resolution are important. This is usually desired for the two conjugate mechanical observables, location and momentum. The first observable refers to the area of microscopy where time-dependent events in real space are to be resolved. The second observable refers to spectroscopy where time of flight measurements with pulsed beams are used to reveal momentum-, energy-, or mass spectra.

Field-emission sources generating free electrons are well known in the art. In most cases they take the form of pointed tips. Hence they are often referred to as point sources, and they are generally defined as a volume in real space of atomic dimensions, comparable to the wavelength of the electrons they emit. Yet conventional tips were just not pointed enough to really meet this definition: The employ of electron-optical lenses was necessary to form a small focus. Well known are also the various aberrations introduced by these lenses, and the coulomb repulsion problems occurring in the focus region.

With the introduction of the sharpest possible tip, i.e. the one ending in one single atom, the art of electron sources has attained a new dimension. Reference is made to the paper by H. -W. Fink et al., "Coherent point source electron beams", J. Vac. Sci. Technol. B 8 (6), November/December 1990, pp. 1323/4. While certain applications might require the use of a single-atom tip, useful results can certainly be obtained in most cases with a tip ending in a hemisphere including about 100atoms. Such a tip can still be called '-ultrasharp' when compared to conventional tips. The description below of an embodiment of the present invention will be based on a tip of this kind.

Ultrasharp tips have already been used as sources of coherent electron beams for the formation of holograms of objects arranged close to those sources. An example for a paper on the subject was published by H. -W. Fink et al., "Holography with Low-Energy Electrons", phys. Rev. Left. 65, No. 10, September 1990, pp. 1204–1206. The projection microscope described in this reference comprises a point source for electrons, a perforated anode holding the object to be investigated, and a two-dimensional electron detector.

As has been explained in two other papers, namely by H. -W. Fink, "L'holographie électronique sans lentille", La Recherche, Vol. 22, No. 234, Juillet/Août 1991, pp. 964–966, and by H. -W. Fink et al., "Atomic Resolution in Lensless Low-Energy Electron Holography", phys. Rev. Left. 67, No. 12, September 1991, pp 1543–1546, these microscopes work without electromagnetic lenses, thus avoiding all of the disadvantages otherwise occurring.

While it is, thus, possible to obtain holographic images of objects with a theoretical resolution down to the atomic level, there are still at least two severe disadvantages inherent in the state of the art electron sources: One disadvantage has to do with the extreme sensitivity of the electron source/object arrangement with respect to vibrations. This leads to blurred images because the coherence of the electron source is lost in that the vibrations tend to simulate a more extended source. The other disadvantage is that only still objects can be investigated while it would be desirable to obtain information on moving objects or on objects that undergo changes during observation.

SUMMARY OF THE INVENTION

It is, therefore, an object of the present invention to overcome these disadvantages.

This object is achieved in accordance with the present invention by a source for intense coherent electron pulses of an energy below 1 keV, which comprises an ultrasharp electron-emitting tip and an anode, both arranged in mutual alignment inside a vacuum envelope, wherein a pulsed potential with an amplitude in the range between 100 V and 500 V and with a variable pulse rate is applied between said tip and said anode, with the tip being negative with respect to said anode, said tip having a sharpness such that the electric field at the surface thereof exceeds $10^7$ V/cm at said pulsed potential.

BRIEF DESCRIPTION OF THE DRAWINGS

Details of the invention will hereafter be described by way of example, with reference to the drawings in which:

FIG. 1 shows a general setup of the electron pulse source in accordance with the invention. An electron point source 1 is arranged inside a vacuum envelope 2, with its longitudinal axis aligned with the axis of the envelope 2. The point source may be of the kind described in H. -W. Fink, "Mono-atomic tips for scanning tunneling microscopy", IBM J. Res. Dev., Vol. 30, No. 5, September 1986, pp. 460–465, but, as mentioned before, tips having more than a single atom at their apex may also be used.

Figure 1:
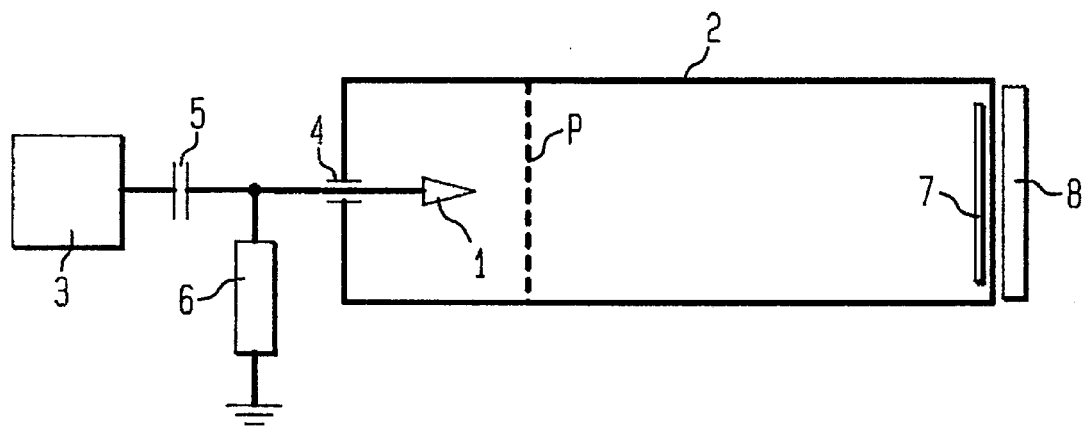
FIG. 1 show schematic view of a first embodiment of the electron pulse source of the present invention.

Tip 1 is connected to a pulse generator 3 by means of a vacuum feedthrough 4 and via a capacitor 5. A resistor 6 having a resistance on the order of 50Ωconnects tip 1 to ground. Pulse generator 3 is adapted to supply a pulsed voltage of between −100 V and −500 V to tip 1, with a variable pulse rate as will be explained below.

Also arranged inside vacuum envelope 2 is an electron detector 7. Electron detectors are well known, and those skilled in the art will appreciate that several types of electron detectors are suitable for application in connection with the present invention. Reference is made to the following publications: J. L. Wiza, "Microchannel plate Detectors", Nuclear Instr. & Methods, Vol. 162, 1979, pp. 587–601, and E. A. Kurz, "Channel Electron Multipliers", Reprint from American Laboratory, March 1979.

For example, if a channel plate detector is used, its disposition should be such that the electrons emitted from tip 1 may hit its surface essentially vertically. If a channeltron type of detector is used, its entrance cone should preferably be aligned with the axis of tip 1. Electron detector 7 may be connected to a conventional display and/or recording unit 8. A dashed line P represents a virtual plane in which an object to be imaged by electrons may be placed.

With the electron detector 7 having a positive potential with respect to tip 1, free electrons will be emitted from the tip by field emission, provided the electric field at the surface of tip 1 exceeds the value of about $10^7$ V/cm, enabling the electrons to "tunnel out" of the potential well and reach the positive electron detector 7. This relatively elevated field strength is easily reached with a very sharply pointed tip 1, in particular, if a tip with only a single atom at its apex is used.

The important parameters in characterizing a useful time-resolved setup are the number of electrons which cause the signal at some detector level, and the pulse duration of the electron beam.

In conventional electron microscopes with a resolution of only a few nanometers, about $10^8$ electrons are required for the generation of a high-contrast image at a two-dimensional electron detector, and within a time frame of a fraction of a second. Repetition times shorter than the usual fraction of a second would result in a significant loss of spatial resolution. And, of course, these electrons have a very high energy since conventional electron micro-scopes operate with acceleration voltages on the order of tens of kilovolts.

In contrast, the free electrons emitted from tip 1 of the electron source in accordance with the present invention have energies only in the range from 100 eV to 500 eV. As will be obvious to those skilled in the electron microscope-scope art, low-energy electron beams lend themselves to the investigation, for example, of biological matter that would immediately be destroyed if impacted by the usual high-energy electron beams used in conventional electron micro-scopes.

In accordance with the invention, the potential across tip 1 and the anode is pulsed at high frequency. Assuming a typical pulse duration of 200 ns and a pulse duty factor of 1, there will be $2.5 \times 10^6$ pulses per second, and each pulse will accommodate $$n = \frac{5 \times 10^{14}}{2.5 \times 10^6} = 2 \times 10^8 \text{ electrons.}$$

Thus, the electron source in accordance with the invention provides for roughly the same number of electrons as the conventional field electron microscope, but the electrons provided have energies smaller by a factor of 100.

Figure 2:
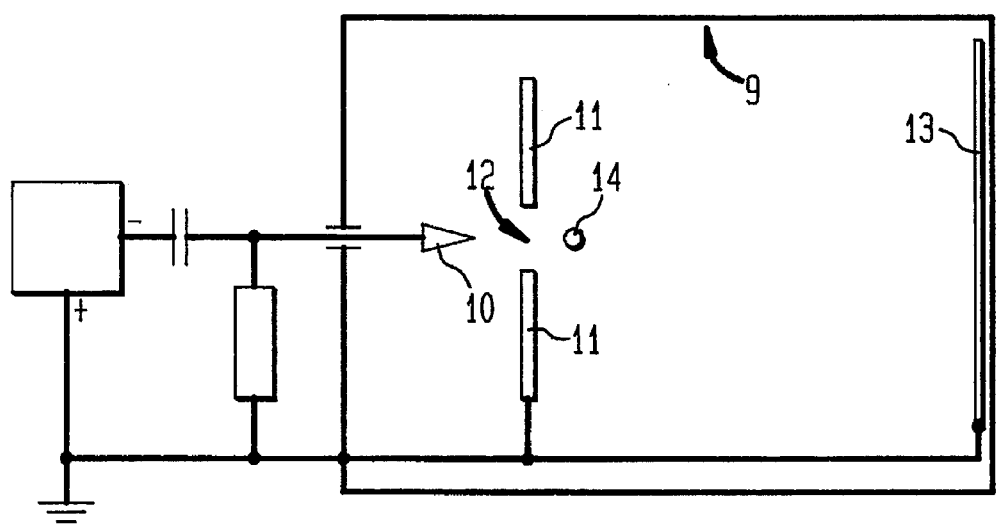
FIG. 2 is a schematic view of a second embodiment of the invention.

Referring now to FIG. 2, one possible application of the electron source of the present invention is the imaging, with atomic resolution, of objects placed in the trajectory of the electron beam. In a vacuum envelope 9, across a sharp field-emission tip 10 and an anode 11, which may, for example, be a metal sheet, there is applied a pulsed potential on the order of 100 V. The pulse frequency may be assumed as being about 5 MHz, thus providing pulses of 100 ns duration with a brightness of $10^8$ electrons each. A spherical wave of coherent radiation is, therefore, emitted from tip 10 and passes through an opening 12 in anode 11. The spherical wave spreads towards a screen 13 as far as it is not restricted by the edge of opening 12. Screen 13 is arranged opposite tip 10 and oriented orthogonally to the axis of the electron beam, at a distance large with respect to the tip 10/anode 12 distance.

Placing an object 14 in front of opening 12 within the electron beam will cause the spherical wave of electrons to become diffracted locally in such a way that the wave front arriving at screen 13 will generate an interference pattern thereon in the form of concentric rings the mutual spacing of which is a function of the phase difference between the original and diffracted waves.

Generally, two cases must be distinguished:

(1) The object is smaller than the diameter of the electron beam at the location of the object (Gabor Hologram). The interference pattern (hologram) on screen 13 will be generated by superposition of the undisturbed part of the electron beam (which usually is called the reference beam) with that part of the beam which was diffracted by the object.

(2) The object is so big that it completely blinds out the electron beam (Transmission Hologram). Obviously, in this case the object must at least be partially transparent to the electron beam. The interference pattern is generated by the electrons passing the object undisturbed and by those that interact with the atoms (or molecules) of the object while passing.

The reconstruction of a hologram is known in the art. Briefly, the hologram must be "illuminated" with a spherical wave analogous to the radiation that was used in its generation. Depending on which side of the hologram —with respect to the viewer—is illuminated, the viewer will see the real or the conjugate image.

Figure 3:
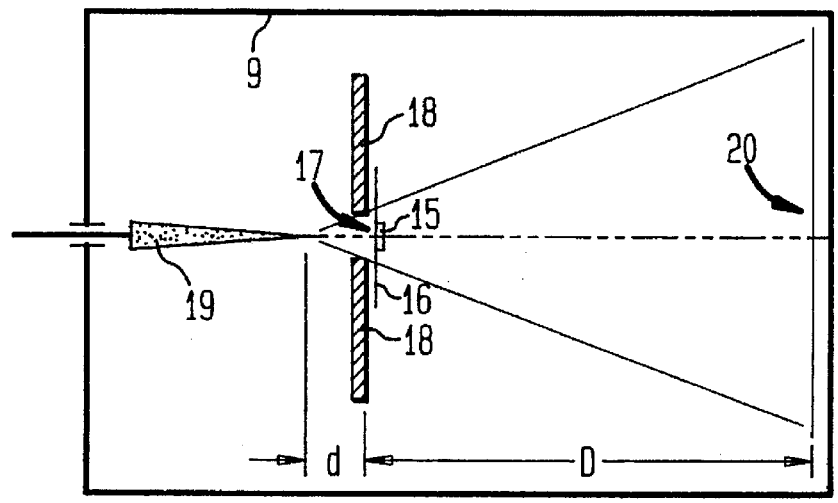
FIG. 3 is a schematic view of a geometry of the electron pulse source of FIG. 2.

In the arrangement of FIG. 3 the object 15 to be inspected is supported on a thin film 16 (transparent to electrons) which is placed across the opening 17 in the anode 18. The distance d between tip 19 and anode 18 is chosen to be microscopic, say d=10 nm, while the distance D between anode 18 and screen 20 is chosen to be macroscopic, say 10 cm. The magnification M provided by this arrangement is simply geometric: M=D/d =$10^6$.

Figure 4:
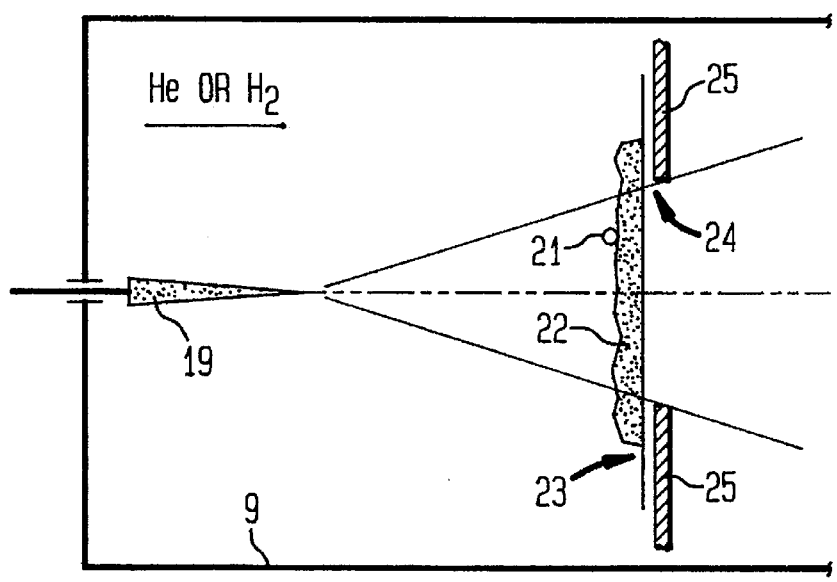
FIG. 4 is a schematic view depicting a further embodiment of the invention.

While in the arrangements shown in the preceding figures direct use was made of the pulsed electron beam emitted by the tip, FIG. 4 shows an embodiment where the usual vacuum is replaced by a gas atmosphere, such as helium or hydrogen. Accordingly, the pulsed electron beam will interact with the gas molecules, and there will be ionized He or $H_2$ (protons), as the case may be. Such an arrangement will, for example, permit the observation, say in 100 ns intervals, of the movement of charges 21 as they jump across an object 22 which is supported on a thin membrane 23 covering an opening 24 in anode 25.

Likewise, it will be possible to observe, down to an atomic level, certain chemical reactions as they take place, provided there are enough atoms/molecules involved in the reaction for an interference pattern to be generated.

While the invention has been shown and described with respect to specific embodiments, numerous modifications, improvements, and changes will become apparent within the scope of the invention.

What is claimed is:

1. A source for intense coherent electron pulses of the type including an ultrasharp electron-emitting tip and an anode arranged in mutual alignment inside a vacuum enevlope, comprising:

means for applying a pulsed potential with an amplitude in the range between 100 V and 500 V and with a varible pulse rate between said tip and said anode, with said tip being negative with respect to said anode; and said tip having a sharpness such that the electric field at the surface thereof exceeds $10^7$ V/cm at said pulsed potential and tip emitted electrons arrive at said anode in pulses with an energy in the range between about 100 V and 500 V.

2. A source for intense coherent electron pulses in accordance with claim 1, wherein said anode is an electron detector connected to supply image data to a recording unit arranged outside of said vacuum envelope, said image data having atomic resolution.

3. A source for intense coherent electron pulse in accordance with claim 1, wherein said pulsed potential has a typical pulse duration of 200 ns and, a duty factor of 1, such that said tip will emit about $2.5 \times 10^6$ pulses per second, each pulse accommodating about $2 \times 10^8$ electrons.

4. A source for intense coherent electron pulses in accordance with claim 1, wherein said anode is designed as a metal sheet having an opening aligned with the axis of said tip;

a screen is arranged opposite said tip and oriented orthogonally with respect to the axis of the electron beam passing through said opening; and the distance between said opening and said screen being large as compared to the distance between said tip and said anode.

5. A source for intense coherent electron pulses in accordance with claim 4, wherein an object is arranged downstream in front of the opening in said anode within the electron beam, such that the electrons arriving at said screen generates an interference pattern thereon.

6. A source for intense coherent electron pulses in accordance with claim 4, wherein an object is arranged on a thin film transparent to electrons and placed across said opening in said anode, the distance between said tip and said anode being on the order of 10 nm, and the distance between said anode and said screen being on the order of 10 cm, thereby providing a magnification of about six orders of magnitude.

7. A source for intense coherent electron pulses in accordance with claim 1, wherein said vacuum envelope contains an atmosphere of gas selected from the group comprising hydrogen and helium, the pulsed electron emitted from said tip thus interacting with the gas molecules causing at least part thereof to become ionized.

8. A source for intense coherent electron pulses in accordance with claim 7, wherein an object is arranged on a thin membrane covering said opening in said anode, said pulsed ionized gas atmosphere permitting the observation of charges as they move across said object.

9. A source of intense coherent electron pulses according to claim 1, wherein said means for applying the pulsed potential provides pulses containing electrons within said energy range at a frequency sufficient to investigate moving objects or objects which undergo change during observation.

10. A method of providing intense coherent electron pulses using an ultrasharp electron-emitting tip and an anode arranged in mutual alignment inside of a vacuum envelope, comprising the steps of:

applying a pulsed potential with an amplitude in the range between 100 V and 500 V and with a variable pulse rate between said tip and said anode, such that said tip is negative with respect to said anode; and providing said tip with a sharpness such that the electric field at the surface thereof exceeds $10^7$ V/cm at said pulsed potential and tip emitted electrons arrive at said anode with an energy in the range of between about 100 V and 500 V in pulses with a brightness greater than $10^8$ electrons per pulse.

11. A method of providing intense coherent electron pulses in accordance with claim 10 wherein said pulsed potential has a typical pulse duration of 200 ns and a duty factor of 1, such that said tip will emit about $2.5 \times 10^6$ pulses per second, each pulse accommodating about $2 \times 10^8$ electrons.

12. A method of providing intense coherent electron pulses in accordance with claim 10 wherein said vacuum envelope contains an atmosphere of gas selected from the group comprising hydrogen and helium, the pulsed electrons emitted from said tip thus interacting with the gas molecules causing at least part thereof to become ionized.

13. A method according to claim 10, including providing pulses of said electrons within said energy range at a frequency sufficient to investigate moving objects or objects which undergo change during observation.

14. In an electron microscope of the type in which a sample is placed inside a vessel with a controlled atmosphere between an electron detector and an ultrasharp electron emitting tip in alignment with an aperture in an anode positioned closer to the tip than the detector to obtain a multiplicative effect, the method of operation comprising:

applying between the tip and the anode a pulsed potential of between 100 and 500 volts in amplitude at a duty cycle and high enough frequency to capture on the electron detector movement of, or change in, the sample at intervals determined by the frequency of the pulsed potential.

15. The method in accordance with claim 14 including the step of using an ultrasharp tip with a sharpness such that the electron field at the surface thereof exceeds $10^7$ V/cm at the pulsed potential.

16. The method in accordance with claim 15 including the step of using an ultrasharp tip with only a single atom at its apex.

17. The method in accordance with claim 15 including the step of maintaining the sample spaced from the tip at a distance less than a micron and spaced from the electron detector at a distance greater than one centimeter.

18. The method in accordance with claim 17 including the step of placing the sample in a gas atmosphere over the hole in the anode between the anode and the tip on a thin transparent membrane so that the sample covers the hole to permit observation of the movement of charges across the sample at intervals determined by the frequency of the pulsed potential.

19. The method in accordance with claim 17 including providing pulses of approximately 200 ns duration at a pulse frequency of about $2.5 \times 10^6$ pulses per second with a brightness of about $10^8$ electrons each.

20. An electron microscope of the type in which a sample is placed inside a vessel with a controlled atmosphere between an electron detector and an ultrasharp electron emitting tip in alignment with an aperture in an anode positioned closer to the tip than the detector to obtain a multiplicative effect, said electron microscope comprising:

means for maintaining the sample spaced from the tip at a distance less than a micron and spaced from the electron detector at a distance greater than one centimeter;

pulse means for applying between the tip and the anode a pulsed potential of between 100 and 500 volts in amplitude at a duty cycle and high enough frequency to capture movement of a charge in the sample on the electron detector determined by the frequency of the pulsed potential.

21. The electron microscope in accordance with claim 20 wherein the ultrasharp tip has a sharpness such that the electron field at the surface thereof exceeds $10^7$ V/cm at the pulsed potential.

22. The electron microscope in accordance with claim 21 wherein the ultrasharp tip has only a single atom at its apex.

23. The electron microscope in accordance with claim 21 wherein the sample is in a gas atmosphere over the hole in the anode between the anode and the tip on a thin transparent membrane so that the sample covers the hole to permit observation of the movement of charges across the sample at intervals determined by the frequency of the pulses potential.

24. The electron microscope in accordance with claim 21 including wherein said pulse means applies pulses of approximately 100 ns duration at a pulse frequency of about 5 MHz with a brightness of about $10^8$ electrons each.

* * * * *